(12) United States Patent
Wang et al.

(10) Patent No.: US 9,513,360 B2
(45) Date of Patent: Dec. 6, 2016

(54) METHOD FOR TESTING MAINFRAME PERFORMANCE OF DIFFERENT TYPES OF PARTIAL DISCHARGE DETECTORS BASED ON ANALOG VOLTAGE SIGNAL INJECTION

(71) Applicants: YUN NAN ELECTRIC TEST & RESEARCH INSTITUTE GROUP CO., LTD. ELECTRIC INSTITUTE, Yunnan (CN); YUNNAN POWER GRID CO. TECHNOLOGY BRANCH, Yunnan (CN)

(72) Inventors: Ke Wang, Yunnan (CN); Xianping Zhao, Yunnan (CN); Junyu Dong, Yunnan (CN); Xiangyu Tan, Yunnan (CN); Jing Peng, Yunnan (CN); Enxin Xiang, Yunnan (CN)

(73) Assignee: The Electric Power Research Institute of Yunnan Power Grid Company Limited, Kunming, Yunnan Province (CN)

( * ) Notice: Subject to any disclaimer, the term of this patent is extended or adjusted under 35 U.S.C. 154(b) by 13 days.

(21) Appl. No.: 14/760,525

(22) PCT Filed: Aug. 12, 2014

(86) PCT No.: PCT/CN2014/000761
§ 371 (c)(1),
(2) Date: Jul. 13, 2015

(87) PCT Pub. No.: WO2015/027664
PCT Pub. Date: Mar. 5, 2015

(65) Prior Publication Data
US 2015/0355307 A1    Dec. 10, 2015

(30) Foreign Application Priority Data
Aug. 26, 2013    (CN) .......................... 2013 1 0376108

(51) Int. Cl.
*G01R 31/08* (2006.01)
*G01R 31/12* (2006.01)
(Continued)

(52) U.S. Cl.
CPC ......... *G01R 35/00* (2013.01); *G01R 19/16571* (2013.01); *G01R 31/00* (2013.01);
(Continued)

(58) Field of Classification Search
CPC . G01R 31/333; G01R 19/16571; G01R 31/00; G01R 31/003; G01R 31/2642; G01R 31/2849; H01H 9/50
(Continued)

(56) References Cited

U.S. PATENT DOCUMENTS

| 5,059,893 A * | 10/1991 | Hiral | G01R 31/2851 324/73.1 |
| 2008/0101185 A1* | 5/2008 | Rozenblit | H03G 3/3042 369/47.53 |
| 2010/0079131 A1* | 4/2010 | Green | H04R 29/00 324/115 |

FOREIGN PATENT DOCUMENTS

| CN | 102508671 A | 6/2012 |
| CN | 102645619 A | 8/2012 |

(Continued)

*Primary Examiner* — Jermele M Hollington
*Assistant Examiner* — Raul Rios Russo
(74) *Attorney, Agent, or Firm* — McNees Wallace & Nurick LLC

(57) ABSTRACT

A method for testing mainframe performance of different types of PD detectors based on analog voltage signal injection, the method comprises: using a function generator (19) with an adjustable output frequency of 0 to 3.5 GHz and an adjustable output amplitude of 0 to 10V, directly injecting or injecting via a DC blocking element (28) with a frequency band of 10 kHz to 10 MHz equivalent analog voltage signals generated by said function generator (19) based on PD
(Continued)

waveforms actually tested by a pulse current PD detection sensor (6), an ultrasound PD detection sensor (12,13) and a UHF PD detection sensor (9) into mainframes of a pulse current PD detector, an ultrasound PD detector and a UHF PD detector respectively. The advantages are that the test method is universalized and standardized, the test result is reproducible and measurable, the application scope of the test object is wide, and the test content is comprehensive.

1 Claim, 4 Drawing Sheets

(51) Int. Cl.
| | | |
|---|---|---|
| *H01H 9/50* | (2006.01) | |
| *G01R 35/00* | (2006.01) | |
| *G01R 31/14* | (2006.01) | |
| *G01R 31/00* | (2006.01) | |
| *G01R 19/165* | (2006.01) | |
| *G01R 31/333* | (2006.01) | |
| *G01R 31/28* | (2006.01) | |
| *G01R 31/26* | (2014.01) | |

(52) U.S. Cl.
CPC ........... *G01R 31/003* (2013.01); *G01R 31/14* (2013.01); *G01R 31/333* (2013.01); *G01R 31/2642* (2013.01); *H01H 9/50* (2013.01)

(58) Field of Classification Search
USPC .......................... 324/500, 512, 514, 530, 536
See application file for complete search history.

(56) References Cited

FOREIGN PATENT DOCUMENTS

| | | |
|---|---|---|
| CN | 102650685 A | 8/2012 |
| CN | 102650686 A | 8/2012 |
| CN | 202502204 U | 10/2012 |
| CN | 103472424 A | 12/2013 |
| EP | 1439396 A2 | 7/2004 |
| JP | 2000147051 A | 5/2000 |

* cited by examiner

METHOD FOR TESTING MAINFRAME PERFORMANCE OF DIFFERENT TYPES OF PARTIAL DISCHARGE DETECTORS BASED ON ANALOG VOLTAGE SIGNAL INJECTION

TECHNICAL FIELD

The present invention belongs to the technical field of partial discharge (PD) detection for electrical devices, and especially adapts to performance testing of a partial discharge detection system for electrical devices.

BACKGROUND

In practically operated electrical devices, due to the variations of manufacturing process, electric field design, improper type-selection, insulation material performance, assembling, etc., under the influences of fluctuating operating voltage, load current, consequent vibration and heat, etc., there are positions of electric field distortion or enhancement, which lead to partial discharge (PD).

Partial discharge can only be controlled but cannot be avoided, and its impacts on the performances of electrical devices are different due to different locations, shapes and types. Burrs on metal conductors will have their sharp corners ablated and rounded under prolonged discharging, and thus the degree of electric field distortion will weaken and the discharging phenomenon might disappear. Nevertheless, if the sharp corners get close to insulator surface, insulation may be deteriorated, causing risks that cannot be pre-controlled. Conductive particles in a fixed state are generally risk-controllable; nevertheless, in the case that the conductive particles have moving and vibrating characteristics, they would cause insulation failure under certain circumstances. Under the effect of the distorted electric field, discharging occurs continuously in air gaps inside the insulating material, which actually short-circuit the discharging air gap in the case that the inside of the discharging cavity is covered with carbonized conductive traces, and thus the electric field distortion is controlled and the discharging phenomenon disappears. There may be, however, a long-term discharge, resulting in deterioration (electrical tree) appearing inside the insulation material, which eventually develops into perforating defects, further leading to insulation failure. Moreover, the decomposition capability of discharging to oil or gas insulation medium would lead to deterioration or failure of the performance of such type of insulation medium and further cause equipment accidents.

For partial discharge detection, the pulse current detection approach based on coupling capacitors is earliest established, and is also complete in terms of standards and technologies thus being most widely used in practice. Being limited to situations that the operating voltage needs to be disconnected in such as researching, labs, commissioning, maintenance, etc., similar to the pulse current detection approach, there is a detection approach based on operating voltage, which is used for electrical devices that have equivalent detection impedance such as lightning arresters. This detection approach is a typical detection approach utilizing an electric connection, with a detection frequency band usually between hundreds of KHz to a few of MHz. Nevertheless, such detection approach is limited in number and the application effect is unknown.

Partial discharge detectors based on ultrasound are classified into two classes, i.e. piezoelectric sensors and non-contact sensors, but accompanied mainframe hardware systems are basically similar, which both perform feature extraction on the signals and draw spectra for time, phase and amplitude of the signals under the power supply frequency. Discharging causes vibration of the insulation medium and the partial discharge detection is performed by detecting the vibration signal after the vibration is transmitted to the distance. Such detection belongs to sound detection approaches, and the detection frequency band is usually within 1 MHz and is on the order of hundreds of KHz.

Any form of discharge would generates electromagnetic wave, which is mainly based on a discharge channel equivalent to a radiation antenna composed of a number of electric dipoles. Partial discharge belongs to the weak discharging type, with a generally narrow discharging channel and weak energy. From the perspective of electric dipoles, generally, the antenna characteristics of the discharging channel of the partial discharge is comparatively obvious and easy to understand. Partial Discharge detection based on UHF (ultra high frequency) is to use an UHF receiving antenna as a detection sensor, and the accompanied mainframe hardware system generally performs the processing with the discharging "cluster-like" signals taken as a unit, i.e., by performing feature extracting on the "cluster" signals and draw spectra for time, phase and amplitude of the signals under the power supply frequency. Partial Discharge detection based on UHF is essentially similar to pulse current PD detection approach and the ultrasound PD detection approach in terms of processing means.

In fact, the sensor is indispensable, no matter for which partial discharge detection approach described above. The detection signal (usually a "cluster-like" wave signal) based on the sensor is input into the PD detection mainframe, processed by both hardware and software, and presented at software side in the form of sequential detection signal. With the widening of the application horizon of the abovementioned PD detection means, nowadays there is wider optional scope with respect to detection devices corresponding to the same principle. Nevertheless, it is an indisputable fact that devices based on the same principle but produced by different manufacturers are inevitably varied in performance. It is to be seriously considered for performance evaluation of different types of devices based on the same detection principle, especially for the fact that: the developing trend for the intelligentization of state grids of the present world and the large-scale application of live-line monitoring and even on-line monitoring for various electrical parameters of the electrical devices lead to the extensive application of the PD detection.

An approach based on analog voltage signal injection is set forth based on the abovementioned facts, which can execute performance testing on different types of PD detector mainframes. By application of this testing approach, the evaluation about the pros and cons of the performances of various detection devices can be realized, providing essential technical support for the selection and network application in power grid of such PD detection devices.

SUMMARY

The present invention generally relates to: generating, using a function generator, with reference to PD waveforms actually tested by sensors of different types, a sequential signal with different types of parameters varying according to predetermined targets; providing, by means of analog voltage signal injection, by directly observing the signals displayed on the mainframes of PD detectors and analyzing the characteristics of the displayed signals, a comprehensive, thorough, quantified and reproducible test on key parameter indices of mainframes of PD detectors of different types; and thereby providing essential technical support for the selection and network application in power grid of such PD detection devices.

The present invention is achieved by the following technical solution.

A method for testing mainframe performance of different types of partial discharge (PD) detectors based on analog voltage signal injection, the method comprises:

(1) using a function generator with an adjustable output frequency of 0 to 3.5 GHz and an adjustable output amplitude of 0 to 10V, directly injecting or injecting via a DC blocking element with a frequency band of 10 kHz to 10 MHz equivalent analog voltage signals generated by said function generator based on PD waveforms actually observed by a pulse current PD detection sensor, an ultrasound PD detection sensor and a ultra high frequency (UHF) PD detection sensor into mainframes of a pulse current PD detector, an ultrasound PD detector and a UHF PD detector respectively;

(2) adjusting the amplitude of and the time intervals of the equivalent analog voltage signals generated by the function generator based on the PD waveforms actually tested by said three kinds of sensors;

(3) generating, using the function generator, analog voltage signals of fixed frequency, mixed frequency, etc., with signal widths corresponding to 50% to 150% of the respective width ranges of the PD waveforms actually observed by the sensors, based on nominal frequency bands of said three kinds of sensors;

(4) achieving direct current voltage blocking for the function generator and the injection of the analog voltage signals to the mainframes of the PD detectors, via a DC blocking element with a frequency band of 10 kHz to 10 MHz, with respect to the injection of analog voltage signals to signal ports of the mainframes of the PD detectors with DC power supply capability;

(5) generating, using the function generator, analog voltage signals at different fixed frequencies within the nominal frequency bands of said three kinds of sensors at a fixed generation time interval of 1 ms to 5 ms, injecting said signals into the mainframes of the PD detectors, and testing the signal detection sensitivity frequency band of the mainframes of the PD detectors by adjusting the amplitudes of said signals, taking any fixed value of the injected signals with its backstage display value larger than 20% to 50% of its background display value as testing criteria;

(6) generating, using the function generator, analog voltage signals at a fixed amplitude but different mixed frequencies within the nominal frequency bands of said three kinds of sensors at a fixed generation time interval of 5 ms to 10 ms, injecting said signals into the mainframes of the PD detectors, and testing the detection performance of the mainframes of the PD detectors with respect to of the restored characteristic parameters for signal amplitudes, signal phases and signal waveforms;

(7) generating, using the function generator, analog voltage signals at a fixed amplitude and a fixed frequency within the nominal frequency bands of said three kinds of sensors at an adjustable generation time interval of 10 μs to 1 ms, injecting said signals into the mainframes of the PD detectors, and testing the signal display resolution performance of the mainframes of the PD detectors;

(8) generating, by the function generator, equivalent analog voltage signals with an adjustable amplitude of 0 to 10V at an adjustable generation time interval of 100 μs to 1 ms, based on the PD waveforms actually observed by said three kinds of sensors, injecting said signals into the mainframes of the PD detectors, and testing the signal spectrogram plotting performance of the mainframes of the PD detectors;

(9) generating, using the function generator, analog voltage signals with an adjustable amplitude of 0 to 10V and a fixed frequency within the nominal frequency bands of said three kinds of sensors at an adjustable generation time interval of 10 μs to 1 ms, injecting said signals into the mainframes of the PD detectors, and testing the diagnostic mode of the mainframes of the PD detectors based on signal spectrogram plotted by the mainframes of the PD detectors;

(10) generating, using the function generator, a sine and a triangular analog voltage signals with an amplitude within 150% of the background display value and a frequency within a range from 50% of the lower limit of the nominal frequency band to 150% of the upper limit of the nominal frequency band of said three kinds of sensors, injecting said signals into the mainframes of the PD detectors, and testing the anti-noise-interference performance of the mainframes of the PD detectors.

The present invention has the following advantageous effect:

The test method is universalized and standardized, the test result is reproducible and measurable, the application scope of the test object is wide, and the test content is comprehensive.

The present invention will be further described with reference to the drawings and embodiments.

Figure 1:
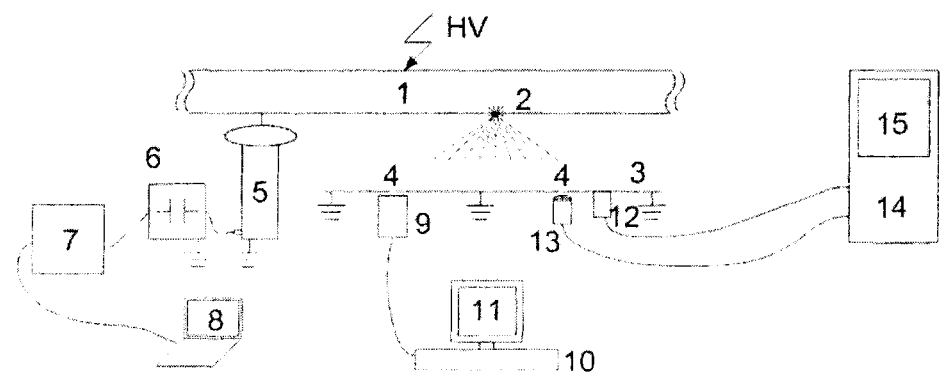
FIG. 1 is a schematic view of the test of different types of PD detectors.

1, high-voltage charged body; 2, defect point; 3, grounded metal enclosure; 4, gap; 5, coupling capacitor; 6, pulse current PD detection impedance; 7, pulse current PD signal processing hardware; 8, pulse current PD signal processing software and display component; 9, UHF PD sensor; 10, UHF PD signal processing hardware; 11, UHF PD signal processing software and display component; 12, piezoelectric ultrasound sensor; 13, non-contact ultrasound sensor; 14, ultrasound PD signal processing hardware; 15, ultrasound PD signal processing software and display component; 16, external power supply signal amplifier; 17, high-speed oscilloscope; 18, waveform information; 19, function generator; 20, analog voltage signal output according to equivalent reduction of actually detected discharge waveform; 21, analog voltage signal with decreased amplitude; 22, analog voltage signal with increased amplitude; 23, manually self-setting pulse signal generated by the function generator; 24, pulse signal with increased frequency and decreased duration; 25, pulse signal with decreased frequency and increased duration; 26, pulse signal with unchanged frequency and increased amplitude; 27, pulse signal with unchanged frequency and decreased amplitude; 28, DC blocking element; 29, signal detection sensitivity frequency band of PD detector mainframe; 30, manually self-setting oscillating attenuating signal generated by the function generator; 31, manually self-setting sine wave signal generated by the function generator; 32, manually self-setting sine signal generated by the function generator; 33, manually self-setting triangle signal generated by the function generator.

d1, d2: generation time intervals between analog voltage signals, which are unequal and adjustable;

d3, d4, d5, d6: generation time intervals between pulse signals, which are unequal and adjustable;

d7, d8, d9: due to differences between signal characteristic parameter extraction methods, there exist variations among separation distances between signal points on the PRPD spectrogram displayed on the mainframes of PD detection devices. In the figures, the function generator generates different types of signals that keep equal separation distances from the zero-point, which distances would be different after being processed and displayed by the PD detection device mainframes.

A, take the time and amplitude corresponding to a point first appearing to be equal to a certain percentage of the peek value of the signal as a characteristic point of the cluster of the signals;

B, take the time and amplitude corresponding to a peek point first appearing in the signal as a characteristic point of the cluster of the signals;

C, take the time and amplitude corresponding to a point last appearing to be equal to a certain percentage of the peek value of the signal as a characteristic point of the cluster of the signal.

DETAILED DESCRIPTION

A method for testing mainframe performance of different types of partial discharge (PD) detectors based on analog voltage signal injection, the method comprises:

(1) using a function generator with an adjustable output frequency of 0 to 3.5 GHz and an adjustable output amplitude of 0 to 10V, directly injecting or injecting via a DC blocking element with a frequency band of 10 kHz to 10 MHz equivalent analog voltage signals generated by said function generator based on PD waveforms actually tested by a pulse current PD detection sensor, an ultrasound PD detection sensor and a ultrahigh frequency (UHF) PD detection sensor into mainframes of a pulse current PD detector, an ultrasound PD detector and a UHF PD detector respectively;

(2) adjusting the amplitude of and the generation time intervals of the equivalent analog voltage signals generated by the function generator based on the PD waveforms actually tested by said three kinds of sensors;

(3) generating, using the function generator, analog voltage signals of fixed frequency, mixed frequency, etc., with signal widths corresponding to 50% to 150% of the respective width ranges of the PD waveforms actually tested by the sensors, based on nominal frequency bands of said three kinds of sensors;

(4) achieving direct current voltage blocking for the function generator and the injection of the analog voltage signals to the mainframes of the PD detectors, via a DC blocking element with a frequency band of 10 kHz to 10 MHz, with respect to the injection of analog voltage signals to signal ports of the mainframes of the PD detectors with DC power supply capability;

(5) generating, using the function generator, analog voltage signals at different fixed frequencies within the nominal frequency bands of said three kinds of sensors at a fixed generation time interval of 1 ms to 5 ms, injecting said signals into the mainframes of the PD detectors, and testing the signal detection sensitivity frequency band of the mainframes of the PD detectors by adjusting the amplitudes of said signals, taking any fixed value of the injected signals with its backstage display value larger than 20% to 50% of its background display value as testing criteria;

(6) generating, using the function generator, analog voltage signals at a fixed amplitude but different mixed frequencies within the nominal frequency bands of said three kinds of sensors at a fixed generation time interval of 5 ms to 10 ms, injecting said signals into the mainframes of the PD detectors, and testing the detection performance of the mainframes of the PD detectors with respect to of the restored characteristic parameters for signal amplitudes, signal phases and signal waveforms;

(7) generating, using the function generator, analog voltage signals at a fixed amplitude and a fixed frequency within the nominal frequency bands of said three kinds of sensors at an adjustable generation time interval of 10 μs to 1 ms, injecting said signals into the mainframes of the PD detectors, and testing the signal display resolution performance of the mainframes of the PD detectors;

(8) generating, by the function generator, equivalent analog voltage signals with an adjustable amplitude of 0 to 10V at an adjustable generation time interval of 100 μs to 1 ms, based on the PD waveforms actually tested by said three kinds of sensors, injecting said signals into the mainframes of the PD detectors, and testing the signal spectrogram plotting performance of the mainframes of the PD detectors;

(9) generating, using the function generator, analog voltage signals with an adjustable amplitude of 0 to 10V and a fixed frequency within the nominal frequency bands of said three kinds of sensors at an adjustable generation time interval of 10 μs to 1 ms, injecting said signals into the mainframes of the PD detectors, and testing the diagnostic mode of the mainframes of the PD detectors based on signal spectrogram plotted by the mainframes of the PD detectors;

(10) generating, using the function generator, a sine and a triangular analog voltage signal with an amplitude within 150% of the background display value and a frequency within a range from 50% of the lower limit of the nominal frequency band to 150% of the upper limit of the nominal frequency band of said three kinds of sensors, injecting said signal into the mainframes of the PD detectors, and testing the anti-noise-interference performance of the mainframes of the PD detectors.

Referring to FIG. 1, FIG. 1 shows a schematic view of the test of different types of PD detectors. In the figure, reference number 1 refers to a high-voltage charged body on which there is a defect point 2 that induces partial discharge. Electromagnetic waves and ultrasound oscillation signals are emitted from the defect point 2 as a source. The grounded metal enclosure 3 is used for safety protection of the electrical device, and would inevitably have gaps 4 during enclosing. Via the coupling capacitor 5, the pulse current PD detection method extracts voltage pulse signal across detection impedance 6. The impedance 6 is essentially an electrical connection signal detection sensor. The signal undergoes processing such as filtering and characteristic signal extraction through a hardware processing component i.e. the pulse current PD signal processing hardware 7, and the detection result is shown via a software and display component i.e. the pulse current PD signal processing software and display component 8. At the gaps 4, on the basis of a UHF radiation signal generated by discharge, the UHF PD sensor 9 (which is essentially a electromagnetic wave receiving antenna) is used to transmit the electromagnetic wave signal caused by discharge to a signal processing hardware component, i.e. the UHF PD signal processing hardware 10; likewise, the signal undergoes processing such as filtering and characteristic signal extraction and the detection result is shown via a software and display component i.e. the UHF PD signal processing software and display component 11. On the basis of ultrasound oscillating transmission signal generated by discharge, a vibration signal induced by electricity can be obtained by pressing the piezoelectric ultrasound sensor 12 against the grounded metal enclosure 3 or making the non-contact ultrasound sensor 13 approach the gap 4. The vibration signal induced by electricity is transmitted to a signal processing hardware component, i.e. the ultrasound PD signal processing hardware 14; likewise, the signal undergoes processing such as filtering and characteristic signal extraction, and the detection result is shown via an ultrasound PD signal processing software and display component 15.

Figure 2:
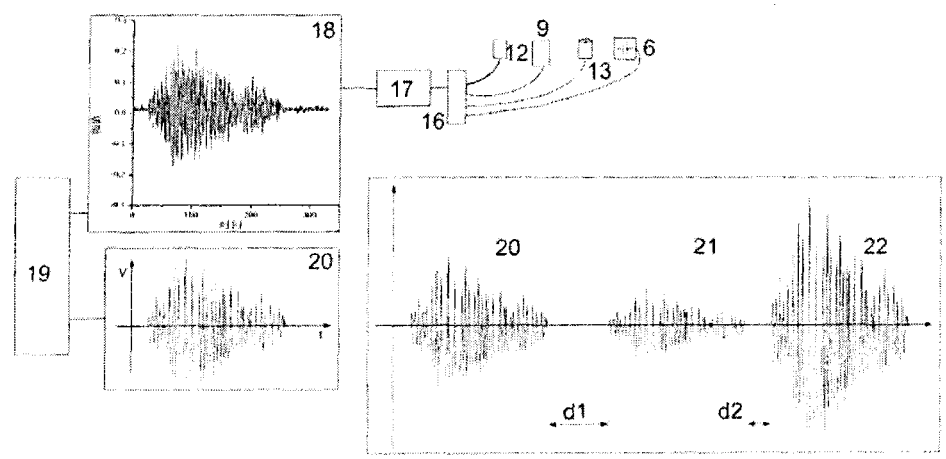
FIG. 2 shows PD waveforms actually observed by the sensors and restored by the function generator, with adjustable amplitude and time interval.

Referring to FIG. 2, FIG. 2 shows PD waveforms actually observed by the sensors and restored by the function generator, with adjustable amplitude and time interval. In the figure, the weak PD signal detected by the pulse current PD detection impedance 6, the UHF PD sensor 9, the piezoelectric ultrasound sensor 12 and the non-contact ultrasound sensor 13, after amplified by external power supply signal amplifier 16, is collected by the high-speed oscilloscope 17 and thus actual waveform information 18 is obtained. The actual waveform information 18 is input into the function generator 19 and is reversely calculated by the function generator 19. The function generator 19 outputs an analog voltage signal 20, which is equivalently restored from the actually detected discharge waveform. Amplitude adjustment can be performed on the basis of the analog voltage signal 20, which is equivalently restored from the actually detected discharge waveform, so as to obtain the amplitude-decreased analog voltage signal 21 and the amplitude-increased analog voltage signal 22 with different and adjustable generation time intervals between the analog voltage signals, i.e., d1 and d2 are changeable.

Figure 3:
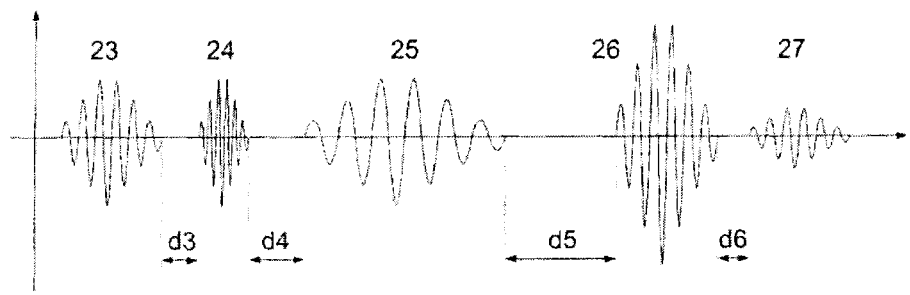
FIG. 3 shows sine pulse wave generated by the function generator, with adjustable frequency, amplitude and time interval.

Referring to FIG. 3, FIG. 3 shows sine pulse wave generated by the function generator, with adjustable frequency, amplitude and time interval. As shown in the figure, by manually setting the manually self-setting pulse signal 23 generated by the function generator, the function generator can further perform: frequency adjusting, wherein the pulse signal 24 is adjusted to have increased frequency and decreased duration, and the pulse signal 25 is adjusted to have decreased frequency and increased duration; and amplitude adjusting, wherein the pulse signal 26 is adjusted to have unchanged frequency and increased amplitude, and the pulse signal 27 is adjusted to have unchanged frequency and decreased amplitude, wherein the duration of the pulse signals vary inversely with respect to frequency. The generation time intervals between the pulse signals are different and adjustable, that is, d3, d4 d5 and d6 are changeable.

Figure 4:
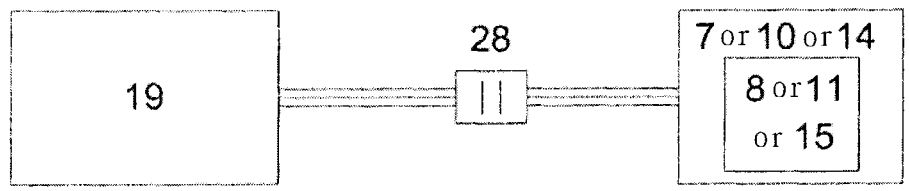
FIG. 4 shows a schematic connection diagram of analog voltage signal injection to a PD detector mainframe signal port with DC power supply capability.

Referring to FIG. 4, FIG. 4 shows a schematic connection diagram of analog voltage signal injection into a PD detector mainframe signal port with DC power supply capability. As shown in the figure, the analog voltage signal generated by the function generator 19 is injected directly or injected via a DC blocking element 28 with a frequency band of 10 KHz to 10 MHz into the signal processing hardware (such as, 7, 10, or 14) of the pulse current PD detector, the ultrasound PD detector and the UHF PD detector respectively, and is displayed via the signal processing software and display components (such as 8, 11 or 15).

Figure 5:
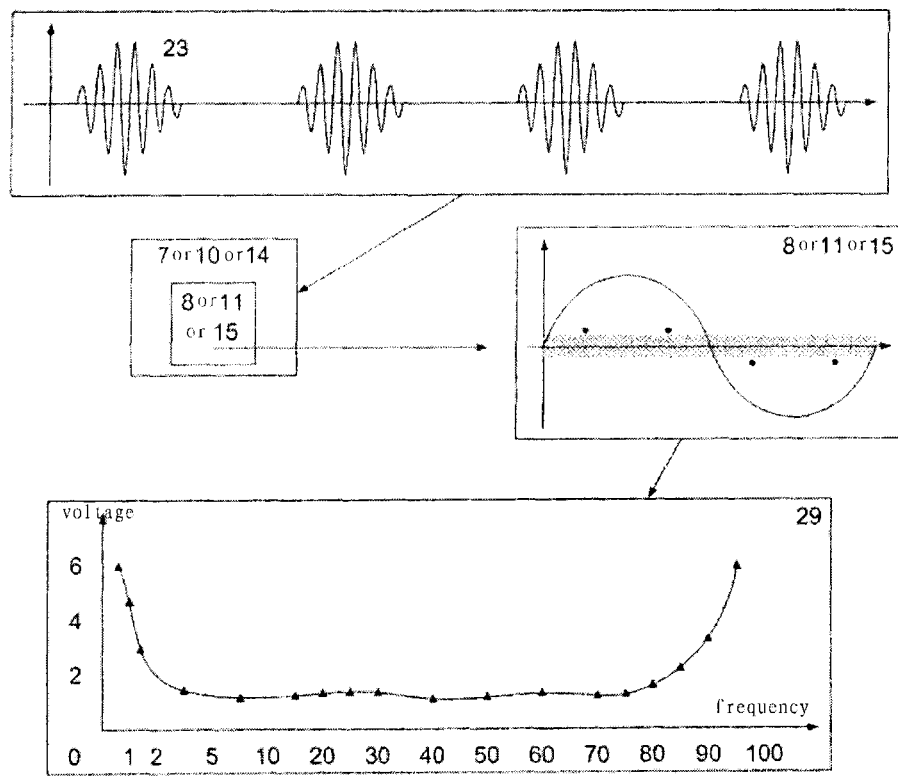
FIG. 5 shows a schematic view of testing of the signal detection sensitivity frequency band of the mainframes of the PD detectors.

Referring to FIG. 5, FIG. 5 shows a schematic view of testing of the signal detection sensitivity frequency band of the mainframes of PD detectors. In the figure, through manually setting and the use of the function generator, the manually self-setting pulse signal 23 is generated by the function generator at an interval of 1 ms to 5 ms. The manually self-setting pulse signal 23 is injected into the signal processing hardware (such as, 7, 10, or 14) of the pulse current PD detector, the ultrasound PD detector and the UHF PD detector, and is shown in standard PRPD spectrogram format via the signal processing software and display components (such as 8, 11 or 15). Taking any fixed value with its backstage display (such as 8, 11 or 15) value larger than 20% to 50% of its background display value as a criterion, a signal detection sensitivity point of the mainframe of the PD detector under this fixed frequency is obtained through adjusting the amplitude of the fixed frequency pulse signal. Pulse signals at other frequencies are regenerated, and their amplitude are adjusted to obtain other signal detection sensitivity points. In this way, within the ranges of nominal frequency bands of different types of sensors, numerous signal detection sensitivity points would be obtained, and a signal detection sensitivity frequency band curve of the PD detector mainframe can be obtained, taking signal frequency as the horizontal axis and signal amplitude as the vertical axis.

Figure 6:
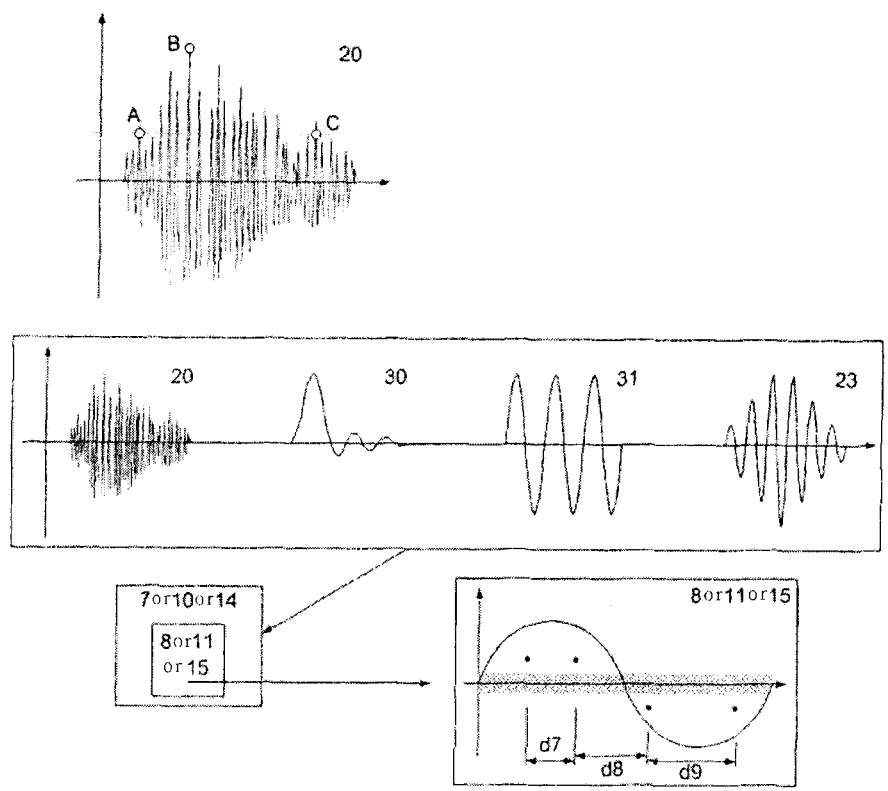
FIG. 6 shows a schematic view of testing of the signal characteristic parameter extraction principle of the mainframes of the PD detectors.

Referring to FIG. 6, FIG. 6 shows a schematic view of testing of the signal characteristic parameter extraction principle of the mainframes of the PD detectors. In the figure, use of the function generator can generate analog voltage signals of fixed amplitude and different mixed frequencies, such as analog voltage signal 20 output according to equivalent reduction of actually tested discharge waveform, manually self-setting pulse signal 23, manually self-setting oscillating attenuating signal 30, and manually self-setting sine wave signal 31 generated by the function generator. The different types of signals, generated by the function generator, which have fixed equal separation distances from the zero-point between 5 ms to 10 ms, are injected into the signal processing hardware (such as, 7, 10, or 14) of the pulse current PD detector, the ultrasound PD detector and the UHF PD detector respectively, and are shown in standard PRPD spectrogram format via the signal processing software and display components (such as 8, 11 or 15). In combination with the separation distance differences d7, d8 and d9 between detection data points of the standard PRPD spectrogram and with reference to possible selection principle of the characteristic points of clustered signals, such as the abovementioned A, B and C (or others), possible extraction principles for deciding signal characteristic parameters of the PD detector mainframes can be tested.

Figure 7:
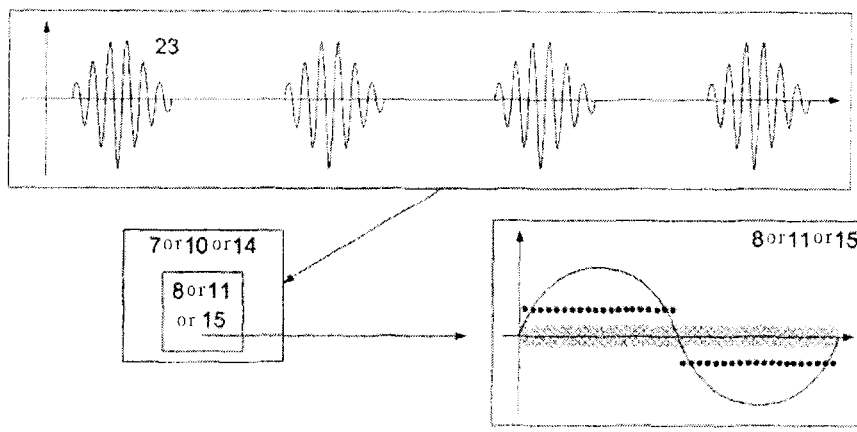
FIG. 7 shows a schematic view of testing of the signal display resolution performance of the mainframes of the PD detectors.

Referring to FIG. 7, FIG. 7 shows a schematic view of testing of the signal display resolution of the mainframes of the PD detectors. In the figure, through manually setting and the use of the function generator, the manually self-setting pulse signal 23 generated by the function generator at a fixed amplitude and a fixed frequency is generated at an adjustable generation time interval of 10 μs to 1 ms. The signal is injected into the signal processing hardware (such as, 7, 10, or 14) of the pulse current PD detector, the ultrasound PD detector and the UHF PD detector respectively, and is shown in standard PRPD spectrogram format via the signal processing software and display components (such as 8, 11 or 15). The signal display resolution performance of the mainframes of the PD detectors is determined in combination with recognizable resolution among the detection data points of standard PRPD spectrogram.

Figure 8:
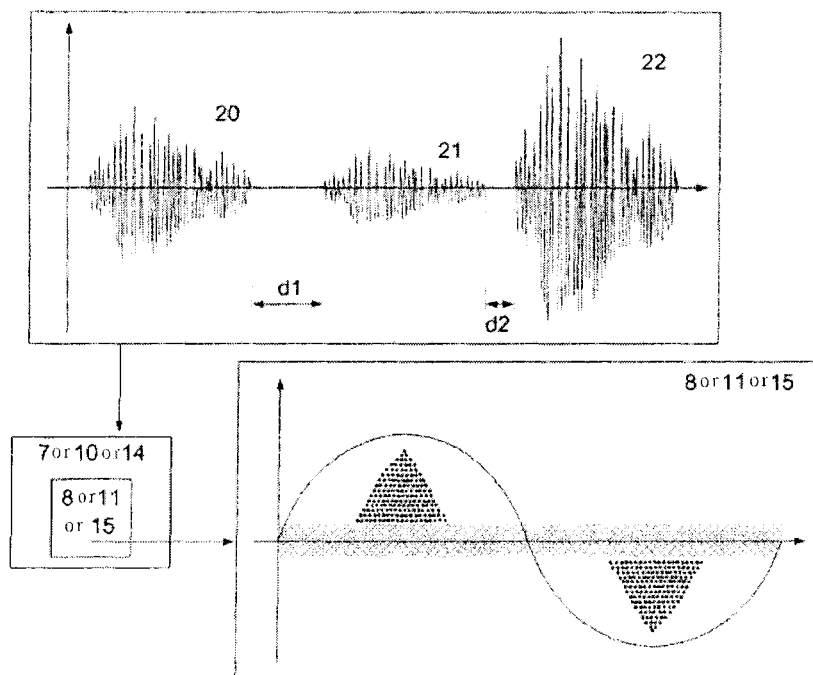
FIG. 8 shows a schematic view of testing of signal spectrogram plotting performance and diagnostic mode of the mainframes of the PD detectors.

Referring to FIG. 8, FIG. 8 shows a schematic view of testing of signal spectrogram plotting performance and diagnostic mode of the mainframes of the PD detectors. In the figure, the analog voltage signals (such as 20, 21 and 22) generated by the function generator with an adjustable amplitude at adjustable time intervals d1, d2 of 100 μs to 1 ms are injected into the signal processing hardware (such as, 7, 10, or 14) of the pulse current PD detector, the ultrasound PD detector and the UHF PD detector respectively, and are shown in standard PRPD spectrogram format via the signal processing software and display components (such as 8, 11 or 15). The signal spectrogram plotting performance of the mainframes of the PD detectors is judged in combination with the comparison between the cumulative graph of the detection data points of the standard PRPD spectrogram and the cumulative graph of theoretic data points (according to (6) in the claim 1, taking FIG. 6 into consideration, the signal characteristic parameter extraction theory of the PD detector mainframe can be tested). Using similar method, whether the diagnostic mode supports the said "nominal diversification" is indirectly judged by: obtaining different PRPD spectrograms based on variation of the injected signals, and observing whether the possible defect types given by the software diagnostic system of the mainframes of the PD detectors has variation and observing the tendency of the variation. The accuracy of the diagnostic mode is judged by: determining the format of the injected signal with reference to existing formats of typical spectrograms, and observing the defect results given by the software diagnostic system of the mainframes of the PD detectors.

Figure 9:
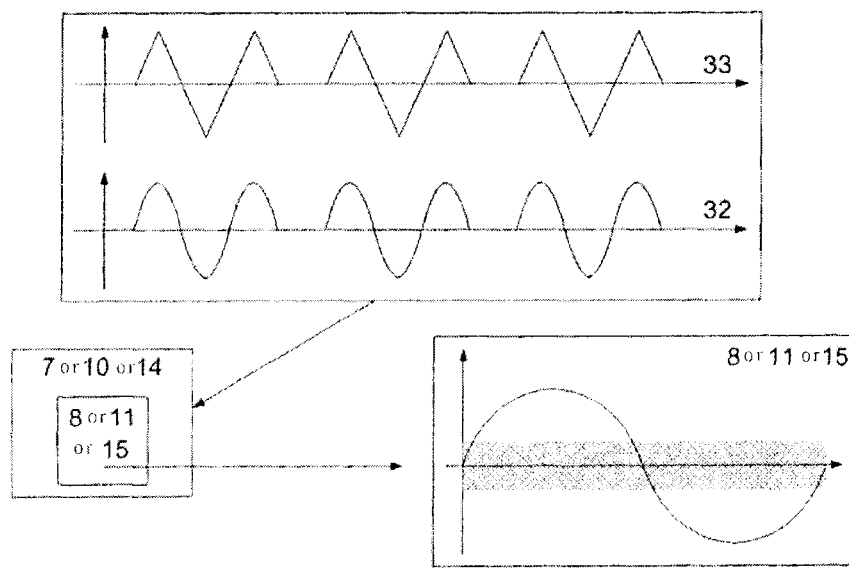
FIG. 9 shows a schematic view of testing of anti-noise performance of the mainframes of the PD detectors.

Referring to FIG. 9, FIG. 9 shows a schematic view of testing of anti-noise interference performance of PD detector mainframes. In the figure, analog voltage signals (a manually self-setting sine signal 32 generated by the function generator, and a manually self-setting triangle signal 33 generated by the function generator) with an amplitude within 150% of the background display value and a frequency within a range from 50% of the lower limit of the nominal frequency band to 150% of the upper limit of the nominal frequency band are generated by the function generator, and the signals are respectively injected into the signal processing hardware (such as, 7, 10, or 14) of the pulse current PD detector, the ultrasound PD detector and the UHF PD detector, and are shown in standard PRPD spectrograms format via the signal processing software and display components (such as 8, 11 or 15). The anti-noise interference performance of the mainframes of the PD detectors is judged by observing the density and amplitude of the plot points of the PRPD spectrograms.

What is claimed is:

1. A method for testing mainframe performance of different types of partial discharge (PD) detectors based on analog voltage signal injection, the method comprises:
   (1) using a function generator with an adjustable output frequency of 0 to 3.5 GHz and an adjustable output amplitude of 0 to 10V, directly injecting or injecting via a DC blocking element with a frequency band of 10 kHz to 10 MHz equivalent analog voltage signals generated by said function generator based on PD waveforms actually observed by a pulse current PD detection sensor, an ultrasound PD detection sensor and a ultra high frequency (UHF) PD detection sensor into mainframes of a pulse current PD detector, an ultrasound PD detector and a UHF PD detector respectively;
   (2) adjusting the amplitude of and the generation time intervals of the equivalent analog voltage signals generated by the function generator based on the PD waveforms actually observed by said three kinds of sensors;
   (3) generating, using the function generator, analog voltage signals of fixed frequency, mixed frequency, etc., with signal widths corresponding to 50% to 150% of the respective width ranges of the PD waveforms actually tested by the sensors, based on nominal frequency bands of said three kinds of sensors;
   (4) achieving direct current voltage blocking for the function generator and the injection of the analog voltage signals to the mainframes of the PD detectors, via a DC blocking element with a frequency band of 10 kHz to 10 MHz, with respect to the injection of analog voltage signals to signal ports of the mainframes of the PD detectors with DC power supply capability;
   (5) generating, using the function generator, analog voltage signals at different fixed frequencies within the nominal frequency bands of said three kinds of sensors at a fixed generation time interval of 1 ms to 5 ms, injecting said signals into the mainframes of the PD detectors, and testing the signal detection sensitivity frequency band of the mainframes of the PD detectors by adjusting the amplitudes of said signals, taking any fixed value of the injected signals with its backstage display value larger than 20% to 50% of its background display value as testing criteria;
   (6) generating, using the function generator, analog voltage signals at a fixed amplitude but different mixed frequencies within the nominal frequency bands of said three kinds of sensors at a fixed generation time interval of 5 ms to 10 ms, injecting said signals into the mainframes of the PD detectors, and testing the detection performance of the mainframes of the PD detectors with respect to of the restored characteristic parameters for signal amplitudes, signal phases and signal waveforms;
   (7) generating, using the function generator, analog voltage signals at a fixed amplitude and a fixed frequency within the nominal frequency bands of said three kinds of sensors at an adjustable generation time interval of 10 μs to 1 ms, injecting said signals into the mainframes of the PD detectors, and testing the signal display resolution performance of the mainframes of the PD detectors;
   (8) generating, by the function generator, equivalent analog voltage signals with an adjustable amplitude of 0 to 10V at an adjustable generation time interval of 100 μs to 1 ms, based on the PD waveforms actually tested by said three kinds of sensors, injecting said signals into the mainframes of the PD detectors, and testing the signal spectrogram plotting performance of the mainframes of the PD detectors;

(9) generating, using the function generator, analog voltage signals with an adjustable amplitude of 0 to 10V and a fixed frequency within the nominal frequency bands of said three kinds of sensors at an adjustable generation time interval of 10 μs to 1 ms, injecting said signals into the mainframes of the PD detectors, and testing the diagnostic mode of the mainframes of the PD detectors based on signal spectrogram plotted by the mainframes of the PD detectors;

(10) generating, using the function generator, a sine and a triangular analog voltage signal with an amplitude within 150% of the background display value and a frequency within a range from 50% of the lower limit of the nominal frequency band to 150% of the upper limit of the nominal frequency band of said three kinds of sensors, injecting said signal into the mainframes of the PD detectors, and testing the anti-noise-interference performance of the mainframes of the PD detectors.

\* \* \* \* \*